US011264475B2

(12) United States Patent
Rahimo et al.

(10) Patent No.: US 11,264,475 B2
(45) Date of Patent: Mar. 1, 2022

(54) SEMICONDUCTOR DEVICE HAVING A GATE ELECTRODE FORMED IN A TRENCH STRUCTURE

(71) Applicant: mqSemi AG, Zug (CH)

(72) Inventors: Munaf Rahimo, Gaensbrunnen (CH); Iulian Nistor, Niederweningen (CH)

(73) Assignee: MQ SEMI AG, Zug (CH)

( * ) Notice: Subject to any disclaimer, the term of this patent is extended or adjusted under 35 U.S.C. 154(b) by 0 days.

(21) Appl. No.: 17/062,760

(22) Filed: Oct. 5, 2020

(65) Prior Publication Data

US 2021/0104614 A1 Apr. 8, 2021

(51) Int. Cl.
*H01L 29/423* (2006.01)
*H01L 29/66* (2006.01)
*H01L 29/78* (2006.01)
*G06F 30/392* (2020.01)

(52) U.S. Cl.
CPC ........ *H01L 29/4236* (2013.01); *G06F 30/392* (2020.01); *H01L 29/66734* (2013.01); *H01L 29/7813* (2013.01)

(58) Field of Classification Search
CPC ........... H01L 29/4236; H01L 29/66734; H01L 29/7813; G06F 30/392
USPC ...................................................... 257/330
See application file for complete search history.

(56) References Cited

U.S. PATENT DOCUMENTS

| 6,777,783 | B2 | 8/2004 | Matsuda |
| 8,546,847 | B2 | 10/2013 | Watanabe |
| 8,653,588 | B2 | 2/2014 | Watanabe |
| 2010/0327313 | A1* | 12/2010 | Nakamura ........ H01L 29/41766 257/133 |
| 2014/0225126 | A1* | 8/2014 | Aketa ............... H01L 21/02529 257/77 |
| 2015/0206960 | A1 | 7/2015 | Hirabayashi |
| 2016/0035859 | A1* | 2/2016 | Senoo ................. H01L 29/1095 438/138 |
| 2016/0211258 | A1* | 7/2016 | Zeng ................... H01L 29/0834 |
| 2017/0207330 | A1* | 7/2017 | Enomoto .......... H01L 21/26506 |

* cited by examiner

*Primary Examiner* — Igwe U Anya
(74) *Attorney, Agent, or Firm* — Tarolli, Sundheim, Covell & Tummino LLP

(57) ABSTRACT

A Metal Oxide Semiconductor (MOS) trench cell includes a plurality of main gate trenches etched in the semiconductor body. In conduction state, the main gate electrode forms vertical MOS channels on the short edges and at least on a portion of the long edges in a mesa of the semiconductor body between neighbouring trenches. The longitudinal direction of the main gate trenches is oriented at an angle between 45 degrees to 90 degrees compared to the longitudinal direction of the first main electrode contacts, in a top plane view. This design offers a wide range of advantages both in terms of performance (reduced losses, improved controllability and reliability) and processability (narrow mesa design rules) and can be applied to both IGBTs and MOSFETs based on silicon or wide bandgap materials such as silicon carbide SiC, zinc oxide (ZnO), gallium oxide ($Ga_2O_3$), gallium nitride (GaN), diamond.

19 Claims, 14 Drawing Sheets

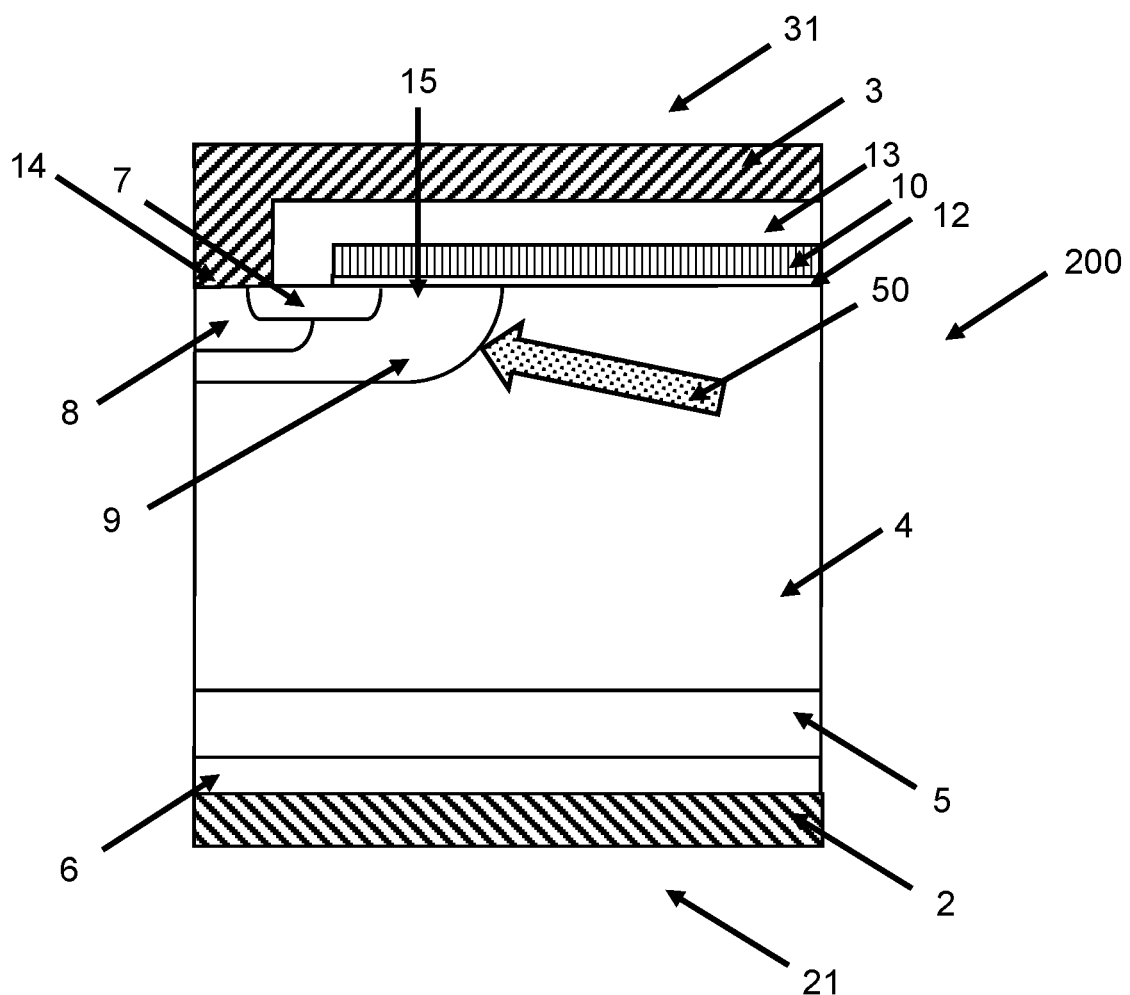
(Prior Art)
Figure (1)

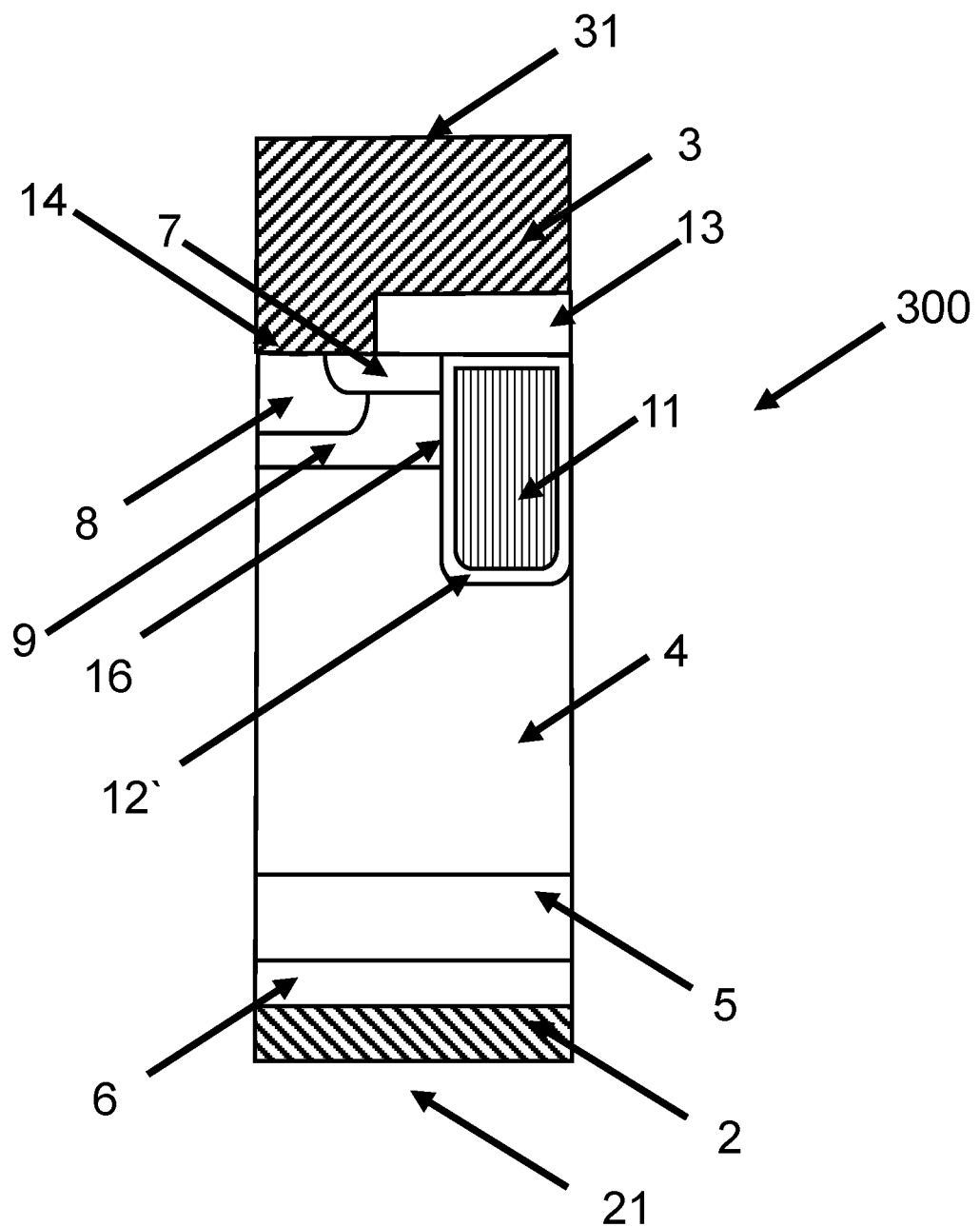
(Prior Art)
Figure (2)

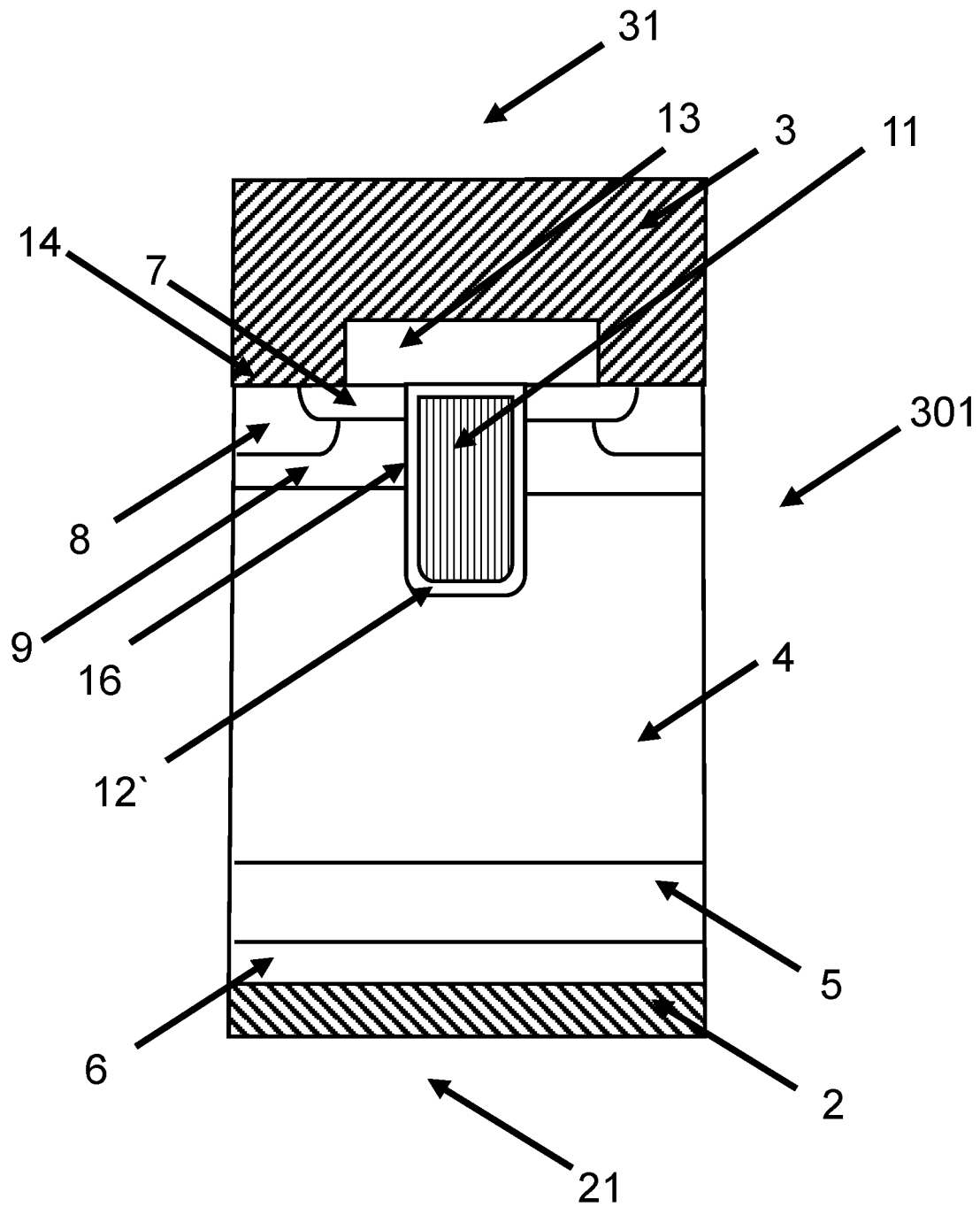
(Prior Art)
Figure (3)

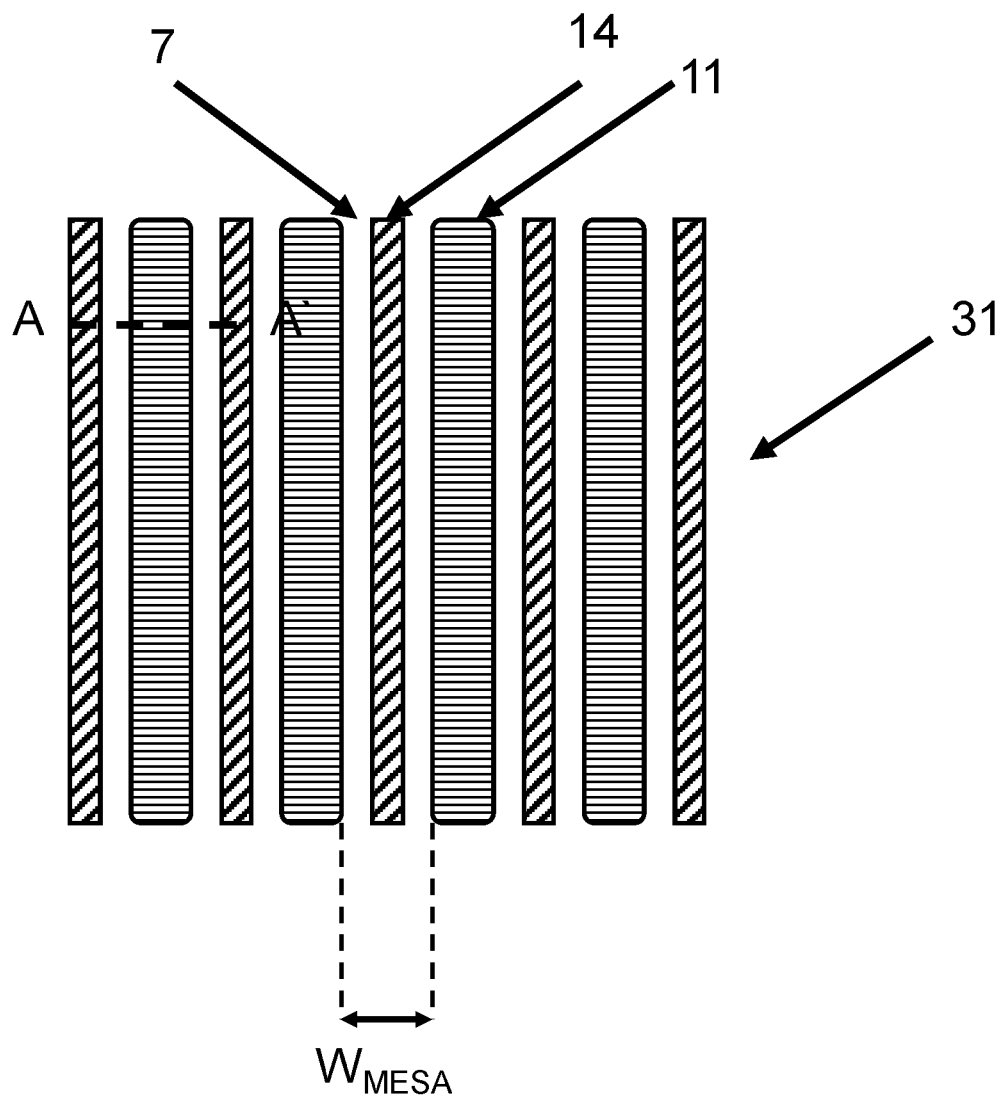
(Prior Art)
Figure (4)

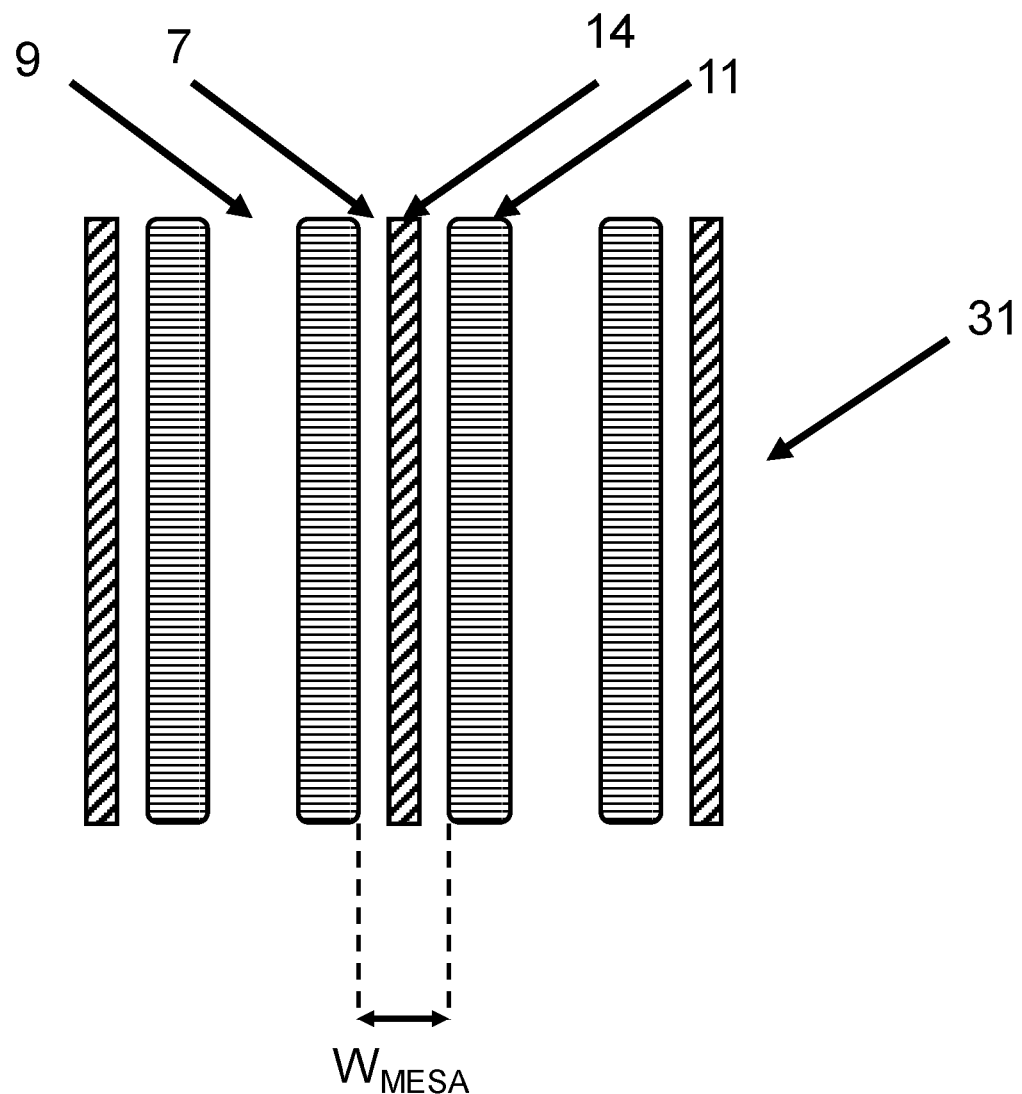
(Prior Art)
Figure (5)

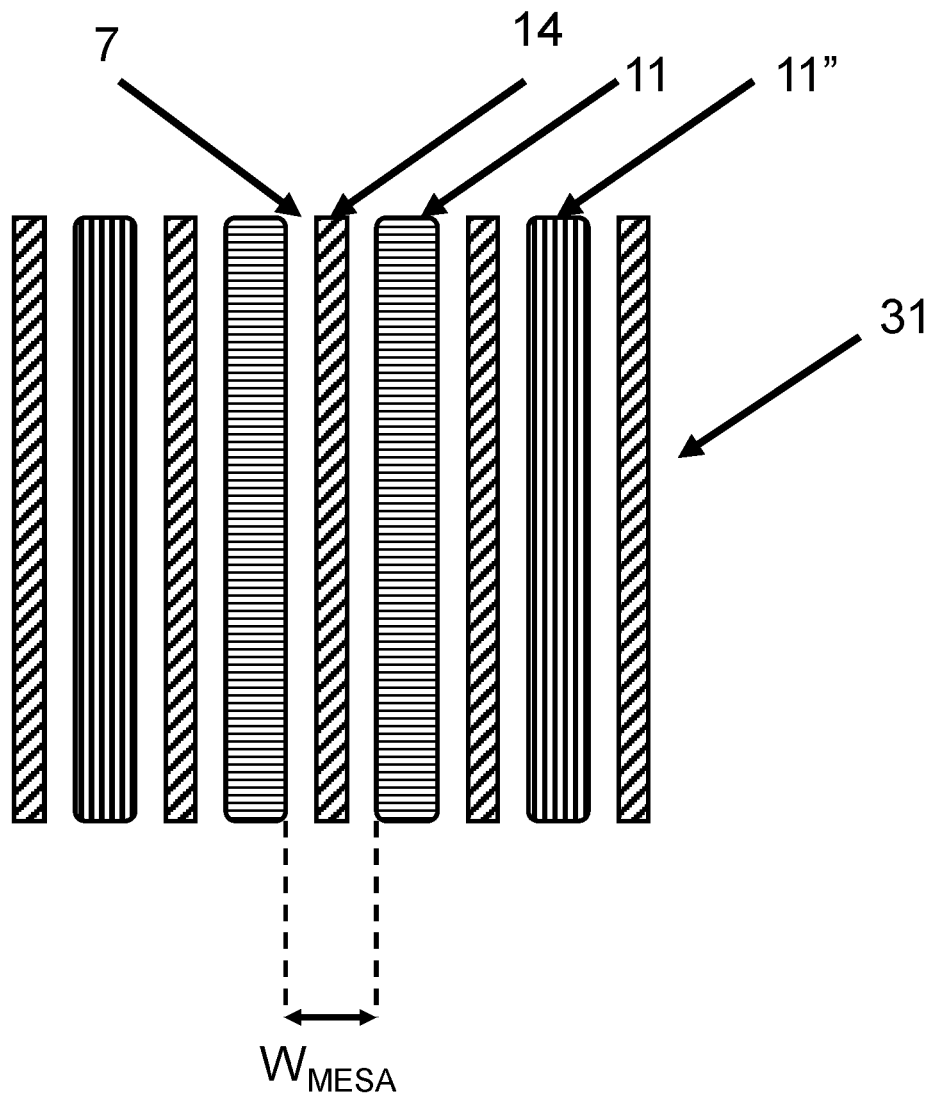
(Prior Art)
Figure (6)

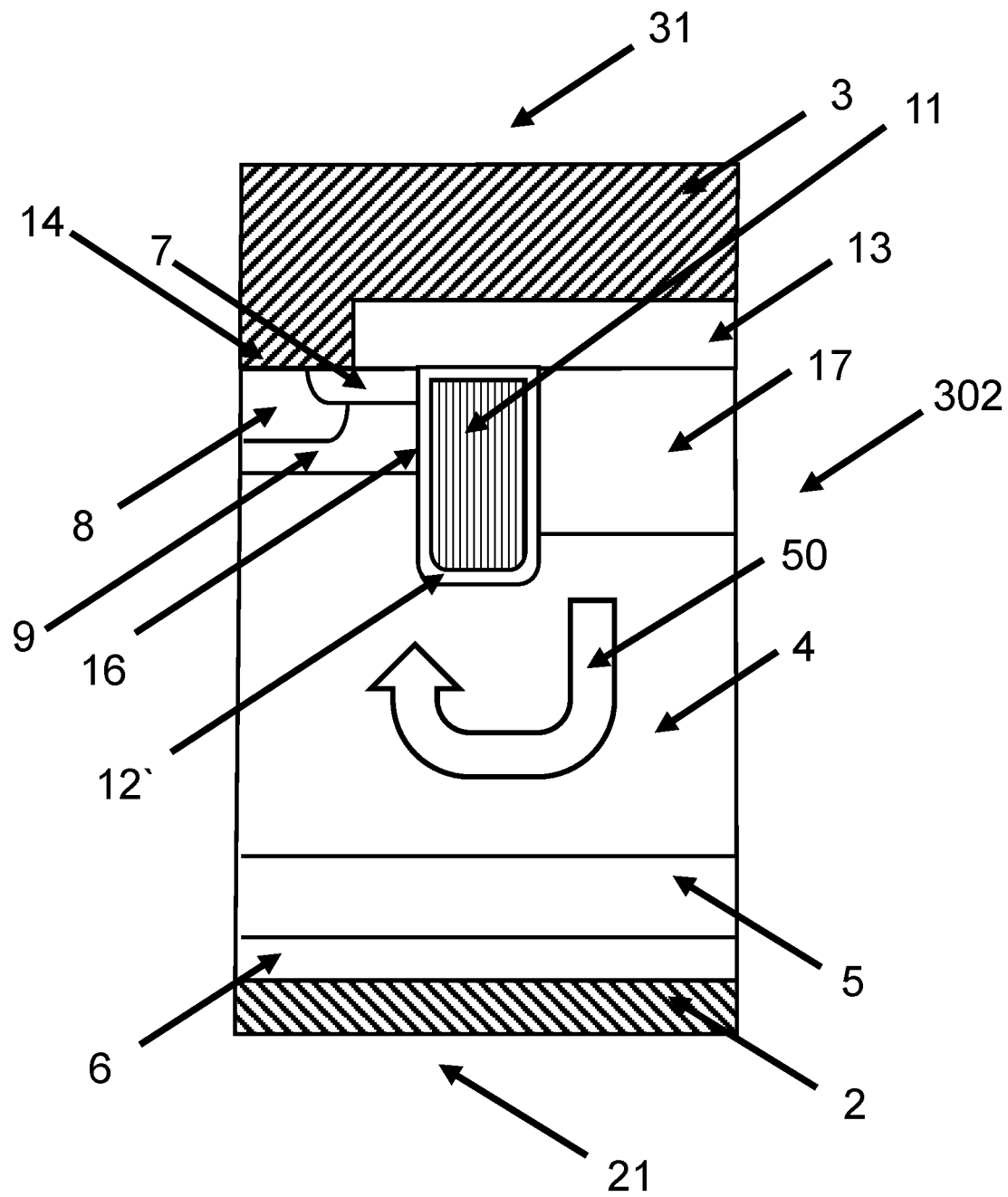
(Prior Art)
Figure (7)

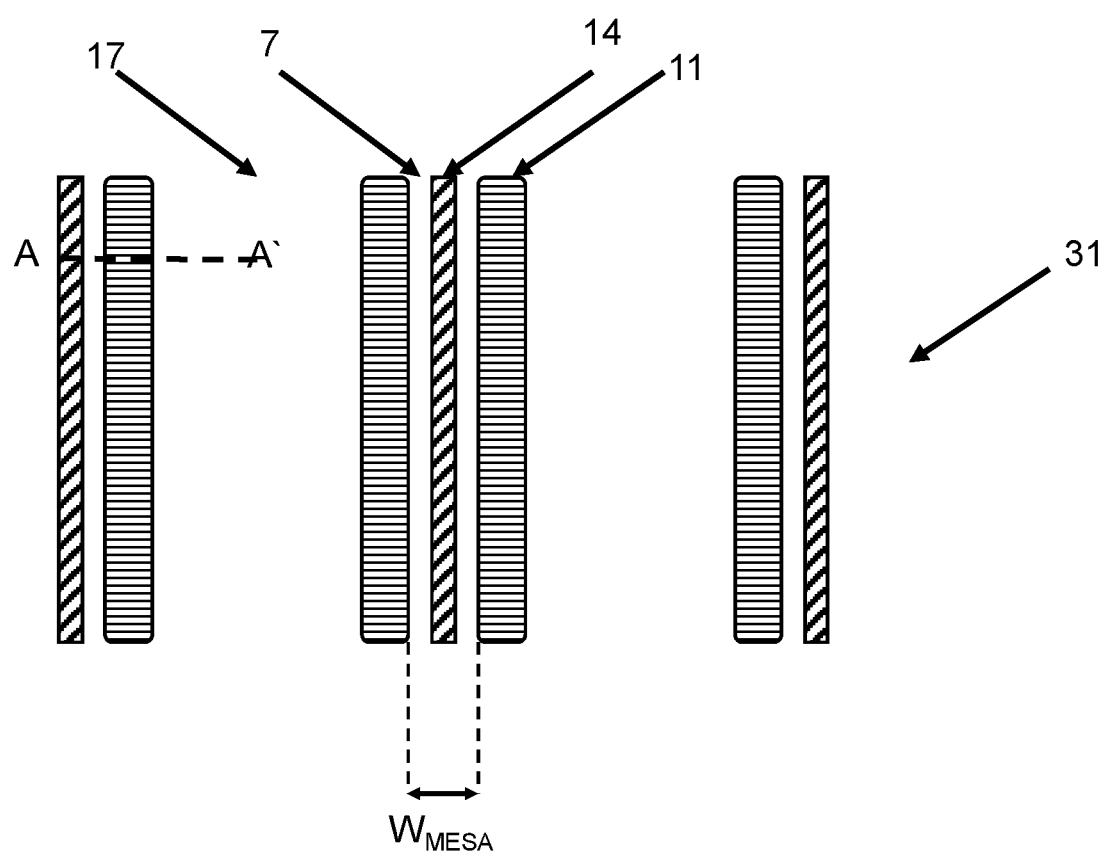
(Prior Art)
Figure (8)

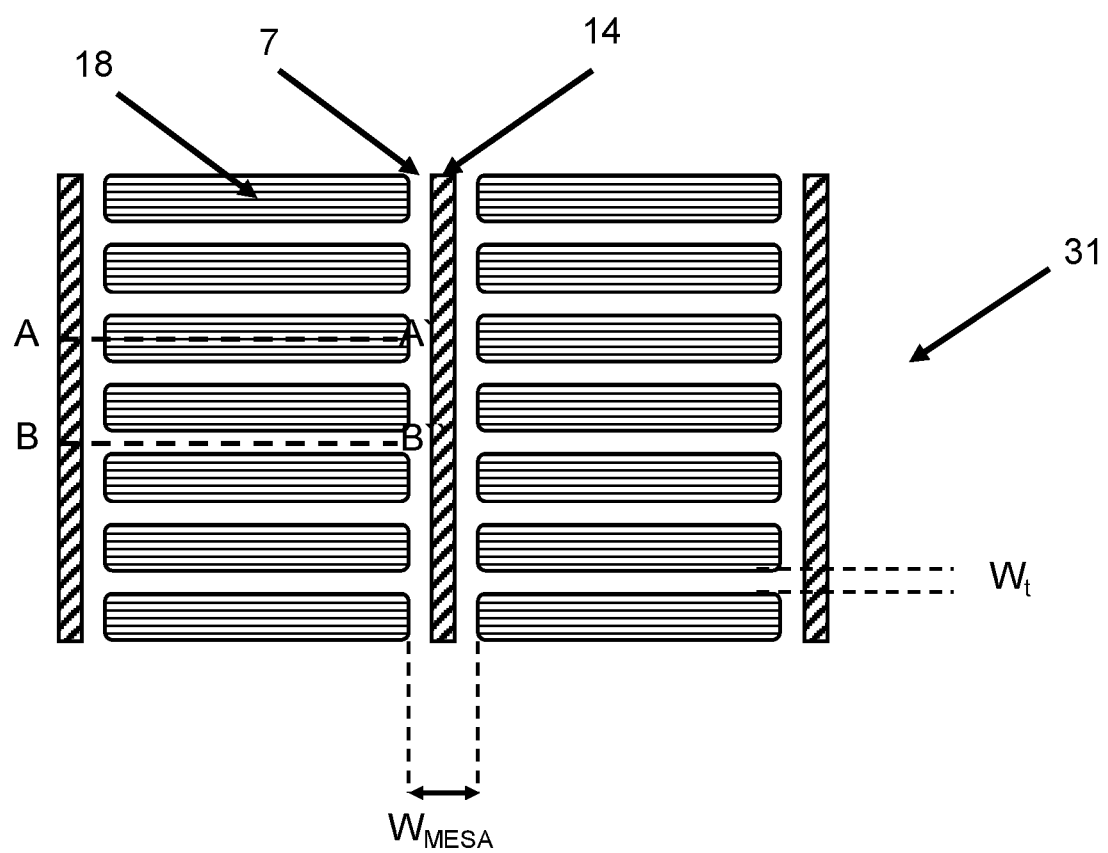
Figure (9)

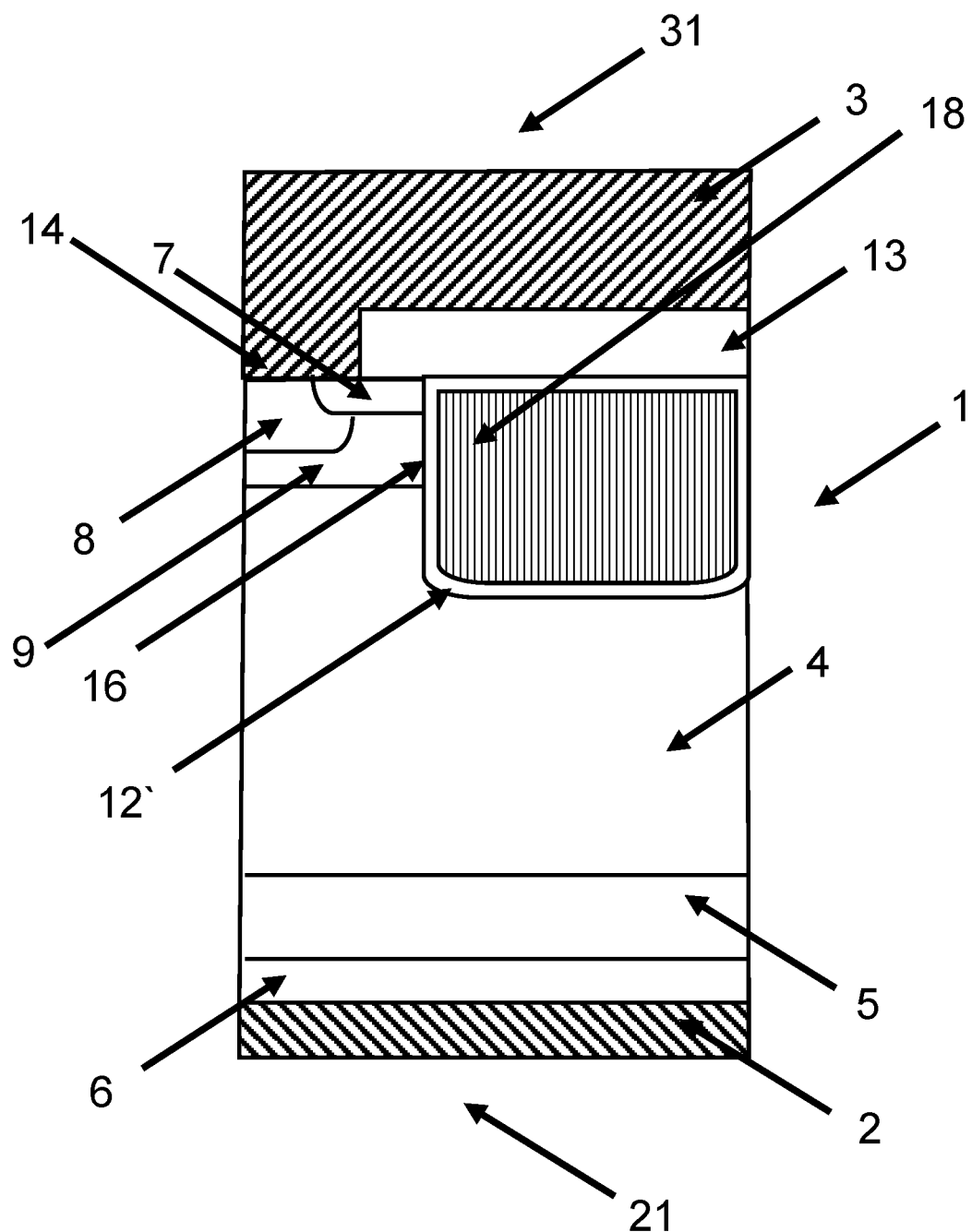
Figure (10)

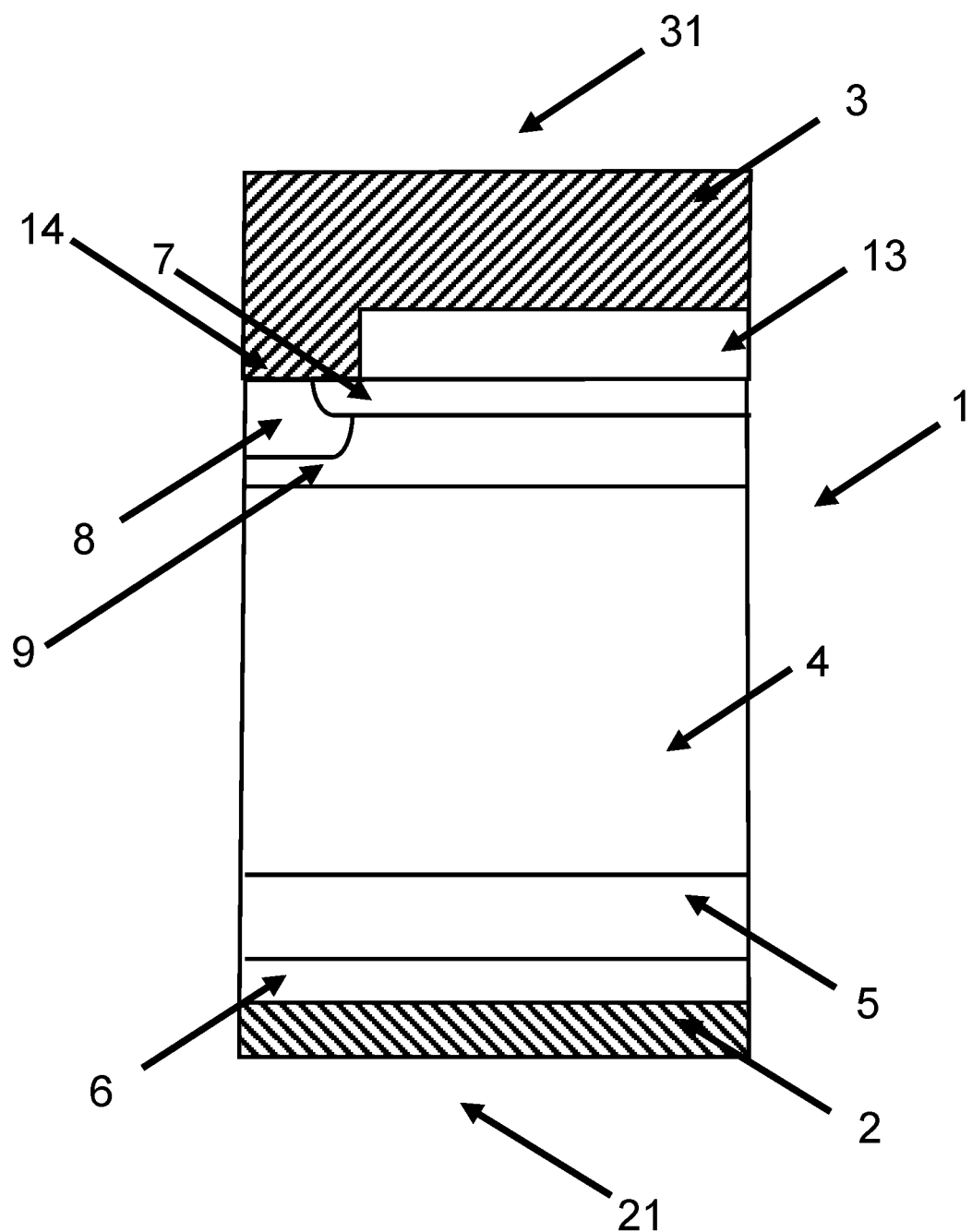
Figure (11)

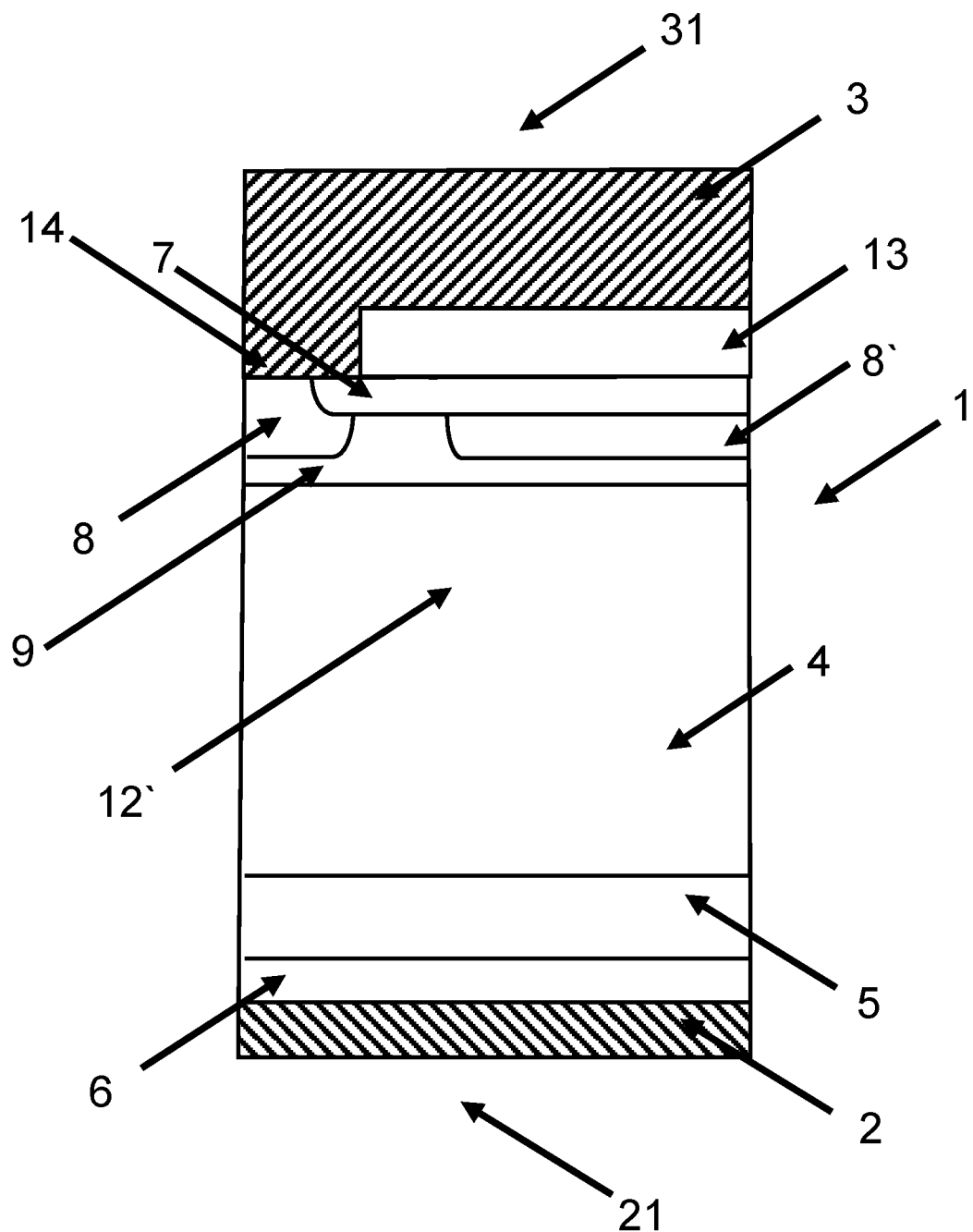
Figure (12)

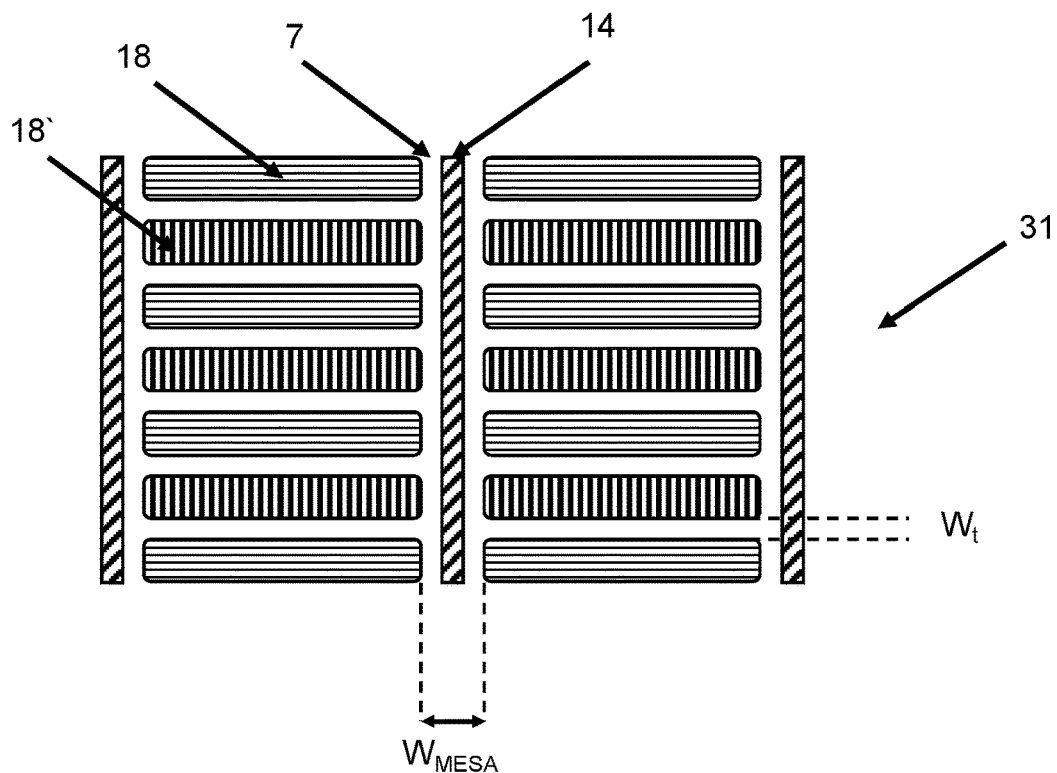
Figure (13)
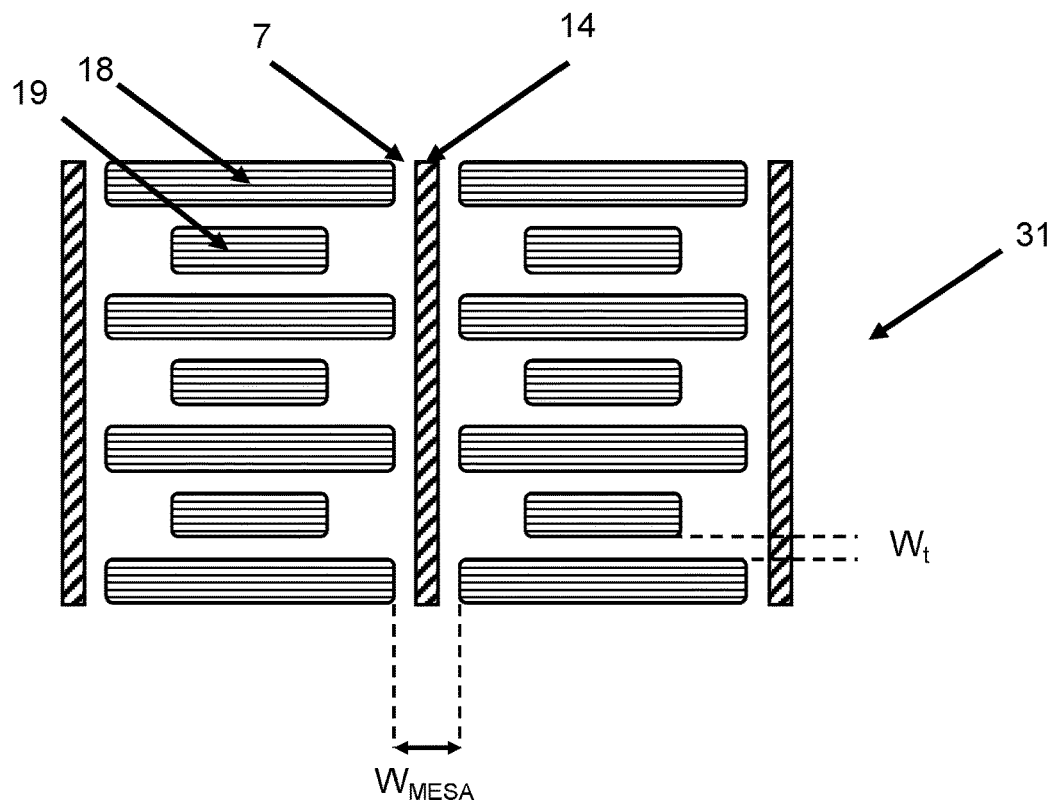
Figure (14)

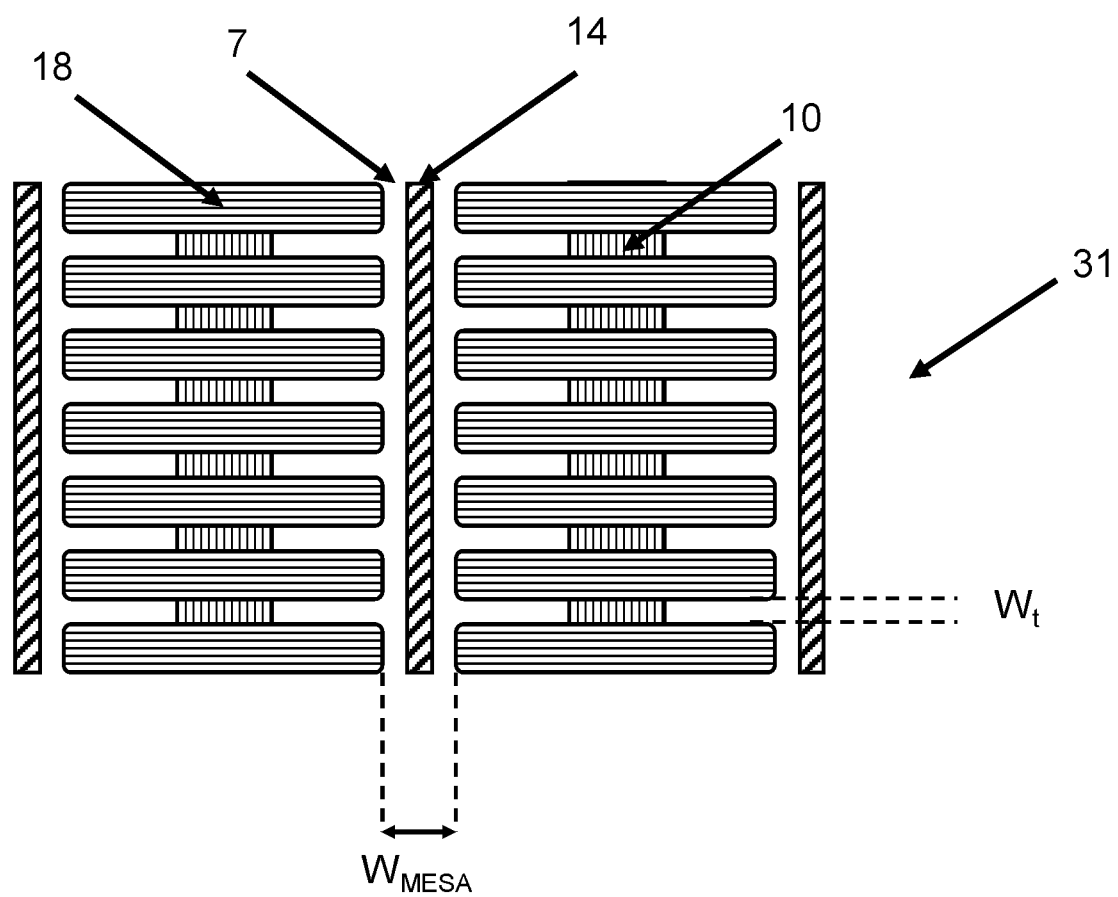
Figure (15)

SEMICONDUCTOR DEVICE HAVING A GATE ELECTRODE FORMED IN A TRENCH STRUCTURE

CROSS-REFERENCE TO RELATED APPLICATIONS

The present application claims priority to GB Patent Application No. 1914274.4 filed on 3 Oct. 2019. The entirety of this application is hereby incorporated by reference for all purposes.

FIELD OF THE INVENTION

The invention relates to the field of power semiconductor devices. Power semiconductor devices that are able to withstand a blocking voltage of several hundred Volts at high current rating are typically implemented as vertical structures, wherein the semiconductor wafer is based for example on a semiconducting material such as silicon (Si) or silicon carbide (SiC) or diamond or gallium oxide (Ga2O3) or gallium nitride (GaN) or zinc oxide (ZnO).

BACKGROUND

Planar and Trench MOS cell designs exhibit a number of advantages and disadvantages for IGBT and MOSFET designs. For IGBTs, typical Planar and Trench designs are shown in FIGS. 1 and 2. Both designs can also incorporate an enhancement n-type layer for improved excess carrier storage (not shown in figures).

FIG. 1 shows a prior art IGBT with planar gate electrodes. The IGBT (200) is a device with a four-layer structure, which are arranged between an emitter electrode (3) on an emitter side (31) and a collector electrode (2) on a collector side (21), which is arranged opposite of the emitter side (31). An N-doped drift layer (4) is arranged between the emitter side (31) and the collector side (21). A P-doped planar base layer (9) is arranged between the drift layer (4) and the emitter electrode (3), which planar base layer (9) is in direct electrical contact to the emitter electrode (3). A planar N-doped source region (7) is arranged on the emitter side (31) embedded into the planar base layer (9), and contacting the opening (14) to the emitter electrode (3). In addition, a planar P-doped region (8) is arranged on the emitter side (31) below region (7) and embedded into the planar base layer (9), and a contact opening (14) through region (7) and extending to region (8) is formed for the emitter electrode (3).

A planar gate electrode (10) is arranged on top of the emitter side (31). The planar gate electrode (10) is electrically insulated from the planar base layer (9), the planar source region (7) and the drift layer (4) by a planar insulating layer (12). There is a further insulating layer (13) arranged between the planar gate electrode (10) and the emitter electrode (3).

The planar cell concept offers a lateral MOS channel (15) which suffers from non-optimal charge spreading (so called JFET effect) near the cell resulting in low carrier enhancement and higher conduction losses. Furthermore, due to the lateral channel design, the planar cell design suffers also from the PNP bipolar transistor hole drain effect (PNP effect) due to the bad spreading of electrons flowing out of the MOS channel. However, the accumulation layer between the MOS cells offers strong charge enhancement for the PIN diode part (PIN effect). The planar design also requires more area resulting in less cell packing density for reduced channel resistance.

On the other hand, the planar design provides good blocking capability due to low peak fields at the cell and in between. The planar design can also provide good controllability and low switching losses due to the presence of direct path to extract the bipolar charge stored between the MOS cells (50) near the emitter side (31). The cell densities in planar designs are also easily adjusted for the required short circuit currents. Due to the fact that there exist few high peak electric fields in the gate oxide regions, the planar design offers good reliability with respect to parameter shifting during operation under high voltages. Also, the introduction of enhanced layers in planar cells has resulted in lower losses rivalling those achieved with trench designs as explained below.

The trench cell concept for a trench IGBT 300 shown in FIG. 2 provides a trench gate electrode (11) which offers a vertical MOS channel (16) for enhanced injection of electrons in the vertical direction, and eliminates the drawback from charge spreading near the cell (JFET effect). Therefore, the trench cells show significantly improved carrier enhancement leading to lower conduction losses. Due to the vertical channel design, the trench offers also less hole drain effect (PNP effect) due to the improved electron spreading out of the MOS channel. Modern trench designs adopting mesa widths (trench to trench distance) below 1 µm achieve very low conduction losses since closely packed trenches can provide a strong barrier to hole drainage. Matching such a performance with less complex processes can be of a great advantage. The accumulation layer at the bottom of the trench offers strong charge enhancement for the PIN diode part. Hence wide and/or deep trenches show optimum performance. Furthermore, the trench design offers large cell packing density for reduced channel resistance.

However, the trench design suffers from lower blocking capability near the bottom corners of the trenches due to high peak electric fields. This has also resulted in parameter shifting during operation due to hot carrier injection into the trench gate oxide (12'). The trench design has also a large MOS accumulation region and associated capacitance resulting in bad controllability and high switching losses. The high cell densities in trench designs will also result in high short circuit currents. Finally, gate parameter shifts can occur under normal gate biasing stress conditions due to the trench etch process in relation to the silicon crystal orientation and the critical region at the n-source and p-base junction which is formed at the trench gate oxide (12') and defines the device MOS parameters.

Hence, optimizing the trench design to overcome the above drawbacks has normally resulted in higher losses when compared to the initial loss estimations and potential of trench designs. Many trench designs have been proposed with particular focus on the regions between the active MOS cells for lowering the losses and improving the device controllability.

By way of example, FIG. 3 shows a prior art "repetitive trench" design cross section along the cut line A-A' indicated in the top view of such a design layout shown in FIG. 4. In many cases, in order to optimise the device electrical characteristics (e.g. capacitances), dummy cells as shown in FIG. 5, or grounded trenches (11') with the gate electrode in direct electrical contact with the electrode (3) as shown in FIG. 6 or a combination of dummy cells and grounded trenches have been proposed as possible solutions in the prior art.

By way of example, FIG. 7 shows a prior art "non-repetitive trench" design cross section along the cut line A-A' indicated in the top view of such a design layout shown in FIG. 8. Non-repetitive trench cell is a design with a pitch separating adjacent trench cells regions. Such a design provides good overall performance. However, in such trench cell designs, a direct path for charge extraction (50) is not provided as in the planar cell designs. This results in non-optimum switching and require some contact to be established to the to the pitch area between cells. This normally results in higher on-state losses. Hence, a trade-off between device controllability and losses is present in most modern trench cell designs.

It is desirable to find a new MOS cell design concept that can still benefit from the trench cell concept while enabling simple process steps and lower conduction/on-state losses.

SUMMARY

It is an object of the present invention to provide a power semiconductor device with reduced on-state losses, low drainage of holes, stable gate parameters, improved blocking capability, and good controllability such as an Insulated Gate Bipolar Transistor (IGBT) with improved electrical characteristics.

These objects can be met by the subject matter of the independent claims. Embodiments of the invention are described with respect to the dependent claims.

The problem is solved by the semiconductor device with the characteristics of claim 1.

The inventive power semiconductor device has layers of different conductivity types, which layers are arranged between an emitter electrode on an emitter side and a collector electrode on a collector side, which is arranged opposite of the emitter side. The layers comprise:
  a drift layer of a first conductivity type, which is arranged between the emitter side and the collector side, the emitter side and the collector side being separated in a first dimension,
  an emitter contact area extending longitudinally in a second dimension along a first horizontal direction in a top plane view; characterized in that, the first horizontal direction can be a specific crystallographic axis in the drift layer, or can be randomly selected to increase the mobility of charge carriers for example,
  a first base layer of a second conductivity type, which is arranged between the drift layer and the emitter electrode,
  a source region of the first conductivity type, which is arranged at the emitter side embedded into the first base layer and contacts the emitter electrode thru the emitter contact area, which source region has a higher doping concentration than the drift layer,
  a second base layer of the second conductivity type, which is arranged at the emitter side embedded into the first base layer and is situated deeper than the source region, and contacts the emitter electrode thru the emitter contact area, which second base layer has a higher doping concentration than the first base layer, and is in direct electrical contact to the emitter electrode,
  a plurality of main trench gate structures arranged on top of the emitter side and extending in the drift layer deeper than the first base layer, having a longitudinal direction at an angle of between 45 degrees to 90 degrees with reference to the first horizontal direction (being also the longitudinal direction of the emitter contact area).

The source region encircles the main gate electrodes. The main gate electrodes are electrically insulated from the emitter electrode by a first insulation layer, and from the source region, the first base layer, and the drift layer by an insulating gate oxide. When a positive voltage is applied on the gate electrodes, a vertical channel is formable between the emitter electrode, the first source region, the first base layer and the drift layer on the short edges of the gate trenches, but also on the long edges of the gate trenches. All or a portion of the plurality of the main trench gate structures are discontinued in their longitudinal direction in the region of the emitter contact areas.

The inventive semiconductor device improves a Trench MOS cell in order to gain the advantages of both designs in terms of reduced on-state losses, low drainage of holes, stable gate parameters, improved blocking and good controllability.

Due to the fact that the area in between the main trench gate structures does not need to be further structured, very high-density trench patterns can be used, with trench mesa dimensions below 100 nm. This will significantly reduce the hole drainage effect as well known to those experts in the field.

In addition, for discontinued gate trenches, the trench mesa dimension can be reduced to 1 μm for further reducing the hole drainage effect while keeping the trench cell dimensions larger than 1 μm.

A portion of the plurality of main gate electrodes can be directly connected to a gate potential, or can be directly connected to the emitter electrode, or made floating. By controlling the number of shorted or floating trench electrodes, the input capacitance of the device can be precisely controlled.

The new design offers a wide range of advantages both in terms of performance (reduced losses, improved controllability and reliability), and processability (very narrow mesa design rules, reliable process compatibility) with the potential of applying enhanced layer structures. The inventive design is suitable for full or part stripes but can also be implemented in cellular designs.

The inventive design is also suitable for reverse conducting structure and can be applied to both IGBTs and MOSFETs based on silicon or wide bandgap materials such as Silicon Carbide SiC.

Those skilled in the art will recognize additional features and advantages upon reading the following detailed description and on viewing the accompanying drawings.

BRIEF DESCRIPTION OF THE DRAWINGS

The embodiments of the invention will be explained in more detail in the following text with reference to the attached drawings, in which:
  FIG. 1: shows the cross section of a Planar MOS IGBT structure (prior art).
  FIG. 2: shows the cross section of a Trench MOS IGBT structure (prior art).
  FIG. 3: shows the cross section of a repetitive Trench MOS IGBT structure (prior art).
  FIG. 4: shows a top view representation of the repetitive Trench MOS IGBT structure in FIG. 3 (prior art).
  FIG. 5: show the top view of Trench MOS IGBT structure with dummy cells (prior art).

FIG. 6: show the top view of Trench MOS IGBT structure with grounded trenches (prior art).

FIG. 7: shows the cross section of a non-repetitive Trench MOS IGBT structure (prior art).

FIG. 8: shows a top view representation of the non-repetitive Trench MOS IGBT structure in FIG. 7 (prior art).

FIG. 9: shows a top view representation of a first exemplary embodiment of a Trench MOS IGBT structure according to the invention.

FIG. 10: shows the cross section along A-A' of first exemplary embodiment according to the invention.

FIG. 11: shows the cross section along B-B' of first exemplary embodiment according to the invention.

FIG. 12: shows the cross section along B-B' of first exemplary embodiment according to the invention, with an additional layer to prevent the source latch-up.

FIG. 13: shows a top view representation of a second exemplary embodiment of a Trench MOS IGBT structure according to the invention, where some of the gate trench electrodes are grounded.

FIG. 14: shows a top view representation of a third exemplary embodiment of a Trench MOS IGBT structure according to the invention, where some of the gate trenches have different longitudinal lengths.

FIG. 15: shows a top view representation of a fourth exemplary embodiment of a Trench MOS IGBT structure according to the invention, where a layer of polysilicon or metal is used to connect the main gate trenches.

The reference symbols used in the figures and their meaning are summarized in the list of reference symbols. The drawings are only schematically and not to scale. Generally, alike or alike-functioning parts are given the same reference symbols. The described embodiments are meant as examples and shall not confine the invention.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure (s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Reference will now be made in detail to various embodiments, one or more examples of which are illustrated in the figures. Each example is provided by way of explanation, and is not meant as a limitation of the invention. For example, features illustrated or described as part of one embodiment can be used on or in conjunction with other embodiments to yield yet a further embodiment. It is intended that the present invention includes such modifications and variations. The examples are described using specific language which should not be construed as limiting the scope of the appending claims. The drawings are not scaled and are for illustrative purposes only. For clarity, the same elements or manufacturing steps have been designated by the same references in the different drawings if not stated otherwise.

Unless otherwise defined, all terms (including technical and scientific terms) used herein have the same meaning as commonly understood by one of ordinary skill in the art to which example embodiments belong. It will be further understood that terms, e. g., those defined in commonly used dictionaries, should be interpreted as having a meaning that is consistent with their meaning in the context of the relevant art. However, should the present disclosure give a specific meaning to a term deviating from a meaning commonly understood by one of ordinary skill, this meaning is to be taken into account in the specific context this definition is given herein.

In this specification, N-doped is referred to as first conductivity type while P-doped is referred to as second conductivity type. Alternatively, the semiconductor devices can be formed with opposite doping relations so that the first conductivity type can be P-doped and the second conductivity type can be N-doped.

Specific embodiments described in this specification pertain to, without being limited thereto, insulated gate bipolar semiconductor devices.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e. g. "between" versus "directly between", "adjacent" versus "directly adjacent," etc.).

A first exemplary embodiment of a power semiconductor device 1 in form of a punch through insulated gate bipolar transistor (IGBT) with a four-layer structure (pnpn) is shown as top view representation in FIG. 9, and as schematic cross sections in FIG. 10 and FIG. 11. The layers are arranged between an emitter electrode (3) on an emitter side (31) and a collector electrode (2) on a collector side (21), which is arranged opposite of the emitter side (31). The emitter electrode forms an emitter contact area (14) with the underlaying layers. The emitter side (31) and the collector side (21) are separated in first dimension. The longitudinal direction of the emitter contact areas in a second dimension can be specific to a geometric axis in the starting material or can be randomly selected.

The IGBT comprises an N-doped drift layer or substrate (4), which is arranged between the emitter side (31) and the collector side (21), the dopant concentration and thickness of this layer being selected to achieve the blocking voltage the semiconductor device is specified for. The thickness of the drift layer (4) may be for example in the range of several μm to several hundred μm. According to an embodiment, the substrate or drift layer (4) is made of a single crystalline semiconductor material such as Silicon, or a material having a band gap of 2.0 eV or higher such as gallium nitride (GaN) or silicon carbide (SiC).

An additional P-doped first base layer (9) is arranged between the drift layer (4) and the emitter electrode (3), and a second P-doped base layer (8) is arranged between the first base layer (9) and the emitter electrode (3), which second base layer (8) is in direct electrical contact to the emitter electrode (3) thru the emitter contact areas (14), and has a higher doping concentration than the first base layer (9). An N-doped source region (7) is arranged at the emitter side

(31) embedded into the first base layer (9), and contacts the emitter electrode (3), which source region has a higher doping concentration than the drift layer (4). The second base layer (8) extends perpendicularly deeper than the source region (7).

A plurality of main gate electrodes is arranged in corresponding trench structures (18), which are formed on the surface of the emitter side (31) and extend deeper into the drift layer (4) than the first base layer (9). The main gate electrodes (18) consist of a heavily doped polycrystalline layer or a metal-containing layer and are electrically insulated from the first base layer (9), the source region (7) and the drift layer (4) by an insulating gate oxide (12'). In one embodiment, the plurality of main gate electrodes (18) is fully encircled by the source region (7). In a typical top plane view, the main gate electrodes (18) are arranged with their longitudinal axis along a third dimension, that forms an angle between 45 degrees to 90 degrees with the longitudinal direction of the emitter contact areas (14). A vertical MOS channel (16) is formable between the emitter electrode (3), the source region (7), the first base layer (9) and the drift layer (4) when positive voltage is applied on the gate electrodes (18). The vertical MOS channel is formable both in the mesa between the short edges of the gate trenches, as well as at least in a portion of the mesa between the long edges of the gate trenches.

Further, an insulating layer (13) electrically insulates the emitter electrode (3) from the main gate electrodes (18), and may include by way of example one or more dielectric layers from silicon oxide, silicon nitride, silicon oxynitride, doped or undoped silicate glass, for example BSG (boron silicate glass), PSG (phosphorus silicate glass) or BPSG (boron phosphorus silicate glass).

In a first embodiment, a P-doped collector layer (6) is arranged on the collector side (2) in direct electrical contact to the collector electrode (2) and a buffer layer (5) is arranged between the collector layer (6) and the drift region (4). Layers (5) and (6) can also be omitted in other embodiments (i.e. unipolar MOSFET device, non-punch-through power semiconductor devices).

The trench regions can be better viewed in the top cell view shown in FIG. 9 for the first main embodiment of the inventive design. The inventive design consists of a trench MOS cell with main gate electrodes embedded in corresponding trench gate structures (18), formed along stripe-shaped designs, having a longitudinal axis extending at an angle between 45 degrees to 90 degrees with respect to the longitudinal direction of the emitter contact area (14). By means of example, only the 90 degrees case, is shown in FIG. 10. In the first dimension, the trenches extend from the emitter side (31) into the drift layer (4). It is possible to form active vertical MOS channels on all or some of the sides of the gate electrodes (18) by means known to those experienced in the field.

At least one of the edges of the trench gate structures (18) may coincide with a major crystal plane or may be tilted at angles between 0 degree and 45 degree with respect to a major crystal plane. According to another embodiment, the trench gate structures (18) can also have a pattern like arrangement on a top plane view of the surface of the emitter side (31) for example squares, hexagons, octagons or other regular polygons.

With respect to the top view shown in FIG. 9, one critical design aspect is the separation $W_{MESA}$ between the short edges of two adjacent main gate electrode trenches (18)—i.e., the separation of the trenches in their longitudinal direction. An additional critical design aspect is the separation distance or mesa $W_t$ between the long edges of adjacent main gate electrode trenches (18). Improved carrier storage/reduced hole drainage is expected as both the dimensions $W_t$ and $W_{MESA}$ are reduced. The value of $W_t$ may be in a range from about 5 µm to below 0.1 µm, more preferably from 1 µm to 0.1 µm—which is achievable with the proposed design because no additional structures have to be lithographically defined in between the trenches (18). Also, improved carrier storage/reduced hole drainage is expected with reducing the distance $W_{MESA}$ by etching the adjacent trenches closer to each other. More specifically, $W_{MESA}$ could extend approximately in a range from about 20 µm to about 0.5 µm, preferably from 5 µm to 0.5 µm, and more preferably from 2 µm to 0.5 µm.

The trenches embedding the main gate electrodes (18) extend in the direction of the drift layer (4) deeper than the first base layer (9). More specifically, the trench extends vertically to a depth approximately in a range from about 2 µm to about 10 µm. The trench width may range from about 4 µm to about 0.5 µm.

As represented in FIG. 11, in the mesa $W_t$ between the main trench electrodes, there is included a larger area of the source region (7). To prevent possible latch up issues with the source region, during the transistor switch-off process, it is possible to use an additional mask, and to structure the source region by limiting its dimensions in a top plane view (7). In an additional embodiment, as showed in FIG. 12, an extension of the second base layer (8') of the second conductivity type can be formed in mesa $W_t$ between the main trench gate electrodes (18), extending perpendicularly deeper than the source region (7). The additional second base layer (8') is either electrically floating or in direct electrical contact to the emitter electrode (3), and has a higher doping concentration than the first base layer (9). The doping concentration of layer (8') can be different than the doping concentration of the second base layer (8). The presence of a highly doped layer (8') will prevent a vertical channel from forming on the surface of the gate trenches in the contact regions between the layer (8') and the long edges of the gate trenches.

In a second embodiment represented as schematic top view in FIG. 13, a portion of the plurality of the main trench gate electrodes (18) are in direct electrical contact with the emitter electrode (3), i.e. they are grounded. This arrangement is useful to precisely tune the input capacitance of the device. Since these grounded gate electrodes do not invert the first base region, the cell containing them is a passive type of cell, as opposed to an active cell controlled by the gate electrodes under voltage potential. By controlling the number of passive cells, the input capacitance of the device can be exactly controlled.

FIG. 14 shows a top view schematic of a third embodiment with gate trenches of various lengths (18) and (19). The width $W_{MESA}$ can be controlled to achieve the lowest possible conduction losses.

FIG. 15 shows a top view schematic of a fourth embodiment where the main gate electrodes (18) are directly connected with each other through additional planar gate electrodes (10) formed on the emitter side (31). These additional conductive layers are electrically insulated from the first base layers (9) by an additional insulating layer, and do not extend beyond the length of the main gate trenches (18). Depending on the arrangement of the source regions (7), it is possible to form none, or more additional lateral/horizontal MOS channels under these planar gate electrodes.

The inventive design is also suitable for a reverse conducting semiconductor device by introducing N-type dopants at the collector side to form shorts in the P-type collector layer (6), and producing an internal anti-parallel diode structure.

A further embodiment includes the use of an enhancement layer of lightly doped N-type conductivity, implanted and diffused in the semiconductor device. The dopants are preferably Phosphorous ions. The dopants are preferably implanted with an energy of 20-100 keV and/or a dose of $5 \times 10^{12}/cm^2$ to $5 \times 10^{13}/cm^2$. The dopants are driven into a maximum depth between 2 μm and 8 μm, in particular between 2 and 6 μm and in particular between 2 and 4 μm. With this enhancement layer, the conduction losses of the semiconductor device are improved.

It is possible to apply the invention to a method for the manufacturing of semiconductor devices, in which the conductivity type of all layers is reversed, i.e. with a lightly p doped drift layer etc.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

REFERENCE LIST

1: inventive trench MOS cell-based power semiconductor device
2: collector metallization (electrode)
21: collector side
3: emitter metallization (electrode)
31: emitter side
4: drift layer, substrate
5: buffer layer
6: collector layer
7: n source layer
8: p second base layer
8': extension of p second base layer
9: p first base layer
10: planar gate electrode, electrically conductive layer
12: insulating gate oxide for planar gate
12': insulating gate oxide for trench gate
13: insulation layer for planar cell and trench cell
14: emitter contact opening
15: horizontal channel for planar gate
16: vertical channel for trench gate
17: p-type layer in dummy regions (trench MOS cells)
18: main trench gate electrodes, electrically conductive layers
18': main trench gate electrodes, in floating or grounded states
19: main trench gate electrodes of different lengths
50: charge extraction path during switching of the power semiconductor device
200: planar MOS cell power semiconductor device (prior art)
300: trench MOS cell power semiconductor device (prior art)
301: repetitive trench MOS cell power semiconductor device (prior art)
302: non-repetitive trench MOS cell power semiconductor device (prior art)

The invention claimed is:

1. A power semiconductor device, comprising:
a substrate or drift layer of a first conductivity type, comprising at least one of Silicon, silicon carbide, gallium nitride, gallium oxide, diamond, and zinc oxide arranged between a first main side and a second main side, wherein the second main side is parallel to the first main side, and wherein the first main side and the second main side are separated in a first dimension;
a first base layer of a second conductivity type, arranged between the substrate or drift layer and a first main electrode;
a first main electrode contact area between the first main electrode and the substrate or drift layer, extending longitudinally in a second dimension specific to a geometric axis in a starting material or randomly selected;
a second main electrode arranged on the second main side;
a source region of the first conductivity type, arranged at the first main side embedded into the first base layer, and contacts the first main electrode thru the first main electrode contact area; wherein the source region has a higher doping concentration than the substrate or drift layer;
a second base layer of the second conductivity type, arranged between the first base layer and the first main electrode, the second base layer is in direct electrical contact to the first main electrode thru the first main electrode contact area, and has a higher doping concentration than the first base layer, wherein the second base layer extends deeper than the source region in the first direction;
a plurality of main gate electrodes of a heavily doped polycrystalline layer or a metal-like layer embedded in corresponding main trench structures, which are arranged on the first main side and extend deeper into the drift layer than the first base layer, wherein:
the main gate electrodes extend longitudinally in a third dimension oriented at an angle between 45 degrees to 90 degrees compared to the longitudinal direction of the first main electrode contacts,
the main gate electrodes are electrically insulated from the first base layer, the source region, and the drift layer by an insulating gate oxide, a vertical MOS channel is formable between the first main electrode, the source region, the first base layer, and the drift layer on the surfaces of the short and long edges of the main gate trenches;
the main gate electrodes are completely encircled by the source region; and,
an interlayer dielectric, which electrically insulates the first main electrode from the plurality of main gate electrodes.

2. The power semiconductor device according to claim 1, wherein at least two of the plurality of main gate electrodes are separated in the third dimension by the first main electrode contact area.

3. The power semiconductor device of claim 1, wherein at least one of:
at least two of the main trench structures have an equal length in the third dimension;
at least two adjacent main trench structures have different lengths in the third dimension;
at least two of the main trench structures have different separations to the first electrode contact area in the third dimension;

at least two of the main trench structures have an equal depth in the first dimension;
at least two adjacent main trench structures have different depths in the first dimension;
at least two of the main trench structures have an equal width in the second dimension;
at least two adjacent main trench structures have different widths in the second dimension.

4. A power semiconductor according to claim 1, wherein the insulating gate oxide layer is of different thickness and/or chemical composition for different trenches.

5. A power semiconductor device according to claim 1, wherein an additional second base layer of the second conductivity type is formed in the drift layer region between the long edges of the main gate trenches, and wherein the additional second base layer reaches deeper in the drift layer than the source region, and has a doping concentration higher than that of the first base layer.

6. A power semiconductor device according to claim 5, wherein:
the main gate electrodes are electrically connected; and,
the additional second base layer completely encircles at least a portion of the plurality of gate trenches.

7. A power semiconductor device according to claim 1, wherein a portion of the plurality of the main gate electrodes are electrically connected to the first main electrode.

8. A power semiconductor device according to claim 1, wherein a portion of the plurality of the main gate electrodes are electrically floating.

9. A power semiconductor device according to claim 1, wherein a portion of the plurality of the main gate electrodes are interconnected on the surface of the first main side through an additional planar gate electrode extending longitudinally in the second dimension; wherein:
the length of the planar gate electrode is shorter than the length of the main gate trenches, and
the additional plane electrode is separated from the source region, the first base layer, the second base layer, and the substrate or drift layer, by an additional insulating layer.

10. A power semiconductor device according to claim 9, wherein at least a portion of the planar gate electrode is separated from the substrate or drift layer by only the additional insulating layer.

11. A power semiconductor device according to claim 1, further comprising:
a buffer layer of the first conductivity type with a higher doping concentration than the drift layer, arranged between the substrate or drift layer and the second main electrode.

12. A power semiconductor device according to claim 1, further comprising:
a collector layer of the second conductivity type arranged on the second main side between the drift layer and the second main electrode; or
a buffer layer of the first conductivity type with a higher doping concentration than the drift layer arranged on the second main side between the drift layer and the second main electrode; and a collector layer of the second conductivity type arranged on the second main side between the buffer layer and the second main electrode.

13. A power semiconductor according to claim 1, wherein an enhancement layer of the first conductivity type is arranged between, and thereby separating the drift layer and the first base layer.

14. A power semiconductor device according to claim 1, comprising:
a reverse conducting type device with a shorted collector layer arranged at the second main side between the second main electrode and a buffer layer, wherein the shorted collector layer is formed by a pattern of opposite conductivity type regions.

15. A power semiconductor device according to claim 1, wherein the distance or mesa between adjacent main gate trenches in the longitudinal direction of the first main electrode contact area in the top view is in a range from 5 μm to below 0.1 μm.

16. A power semiconductor device according to claim 1, wherein the distance between the walls of adjacent main gate trenches in their longitudinal direction in the top view, extends in a range from 20 μm to 0.5 μm.

17. A power semiconductor device according to claim 1 having a stripe layout design or a cellular layout design.

18. Semiconductor module package comprising at least one device according to claim 1.

19. Converter with a plurality of devices according to claim 1.

* * * * *

UNITED STATES PATENT AND TRADEMARK OFFICE
CERTIFICATE OF CORRECTION

| | |
|---|---|
| PATENT NO. | : 11,264,475 B2 |
| APPLICATION NO. | : 17/062760 |
| DATED | : March 1, 2022 |
| INVENTOR(S) | : Rahimo et al. |

It is certified that error appears in the above-identified patent and that said Letters Patent is hereby corrected as shown below:

On the Title Page

Insert Item (30): Foreign Application Priority Data: --GB 1914274.4 filed on October 3, 2019--

Signed and Sealed this
Tenth Day of May, 2022

Katherine Kelly Vidal
*Director of the United States Patent and Trademark Office*